(12) United States Patent
Lee et al.

(10) Patent No.: US 9,634,160 B2
(45) Date of Patent: Apr. 25, 2017

(54) SOLAR CELL AND METHOD FOR MANUFACTURING THE SAME

(71) Applicant: LG ELECTRONICS INC., Seoul (KR)

(72) Inventors: Kyoungsoo Lee, Seoul (KR); Myungjun Shin, Seoul (KR); Jiweon Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/605,462

(22) Filed: Jan. 26, 2015

(65) Prior Publication Data

US 2015/0129033 A1    May 14, 2015

Related U.S. Application Data

(62) Division of application No. 13/469,815, filed on May 11, 2012, now Pat. No. 8,969,125.

(30) Foreign Application Priority Data

Dec. 16, 2011 (KR) .................. 10-2011-0136467

(51) Int. Cl.
*H01L 31/0216* (2014.01)
*H01L 31/0224* (2006.01)
*H01L 31/0236* (2006.01)
*H01L 31/068* (2012.01)

(52) U.S. Cl.
CPC .. *H01L 31/02366* (2013.01); *H01L 31/02167* (2013.01); *H01L 31/02363* (2013.01); *H01L 31/022425* (2013.01); *H01L 31/068* (2013.01); *Y02E 10/547* (2013.01)

(58) Field of Classification Search
CPC .............................................. H01L 31/022441
USPC ............................................................ 257/437
See application file for complete search history.

(56) References Cited

U.S. PATENT DOCUMENTS

| | | | |
|---|---|---|---|
| 4,886,555 A | 12/1989 | Hackstein et al. | |
| 6,147,297 A | 11/2000 | Wettling et al. | |
| 7,858,426 B2 | 12/2010 | Cheong et al. | |
| 8,420,435 B2 | 4/2013 | Rana et al. | |
| 2003/0178057 A1 | 9/2003 | Fujii et al. | |
| 2005/0189015 A1 | 9/2005 | Rohatgi et al. | |
| 2005/0217717 A1* | 10/2005 | Faris ............................ | 136/252 |
| 2005/0252544 A1 | 11/2005 | Rohatgi et al. | |
| 2008/0241986 A1 | 10/2008 | Rohatgi et al. | |

(Continued)

FOREIGN PATENT DOCUMENTS

| | | |
|---|---|---|
| EP | 2312650 A2 | 4/2011 |
| JP | 07-307449 A | 11/1995 |

(Continued)

*Primary Examiner* — Earl Taylor
(74) *Attorney, Agent, or Firm* — Dentons US LLP

(57) ABSTRACT

A method for manufacturing asolar cell includes texturing a front surface of a semiconductor substrate having a first conductive type dopant by using a dry etching method, forming an emitter layer by ion-implanting a second conductive type dopant into the front surface of the semiconductor substrate, forming a back passivation film on a back surface of the semiconductor substrate; and forming a first electrode electrically connected to the emitter layer and a second electrode being in partial contact with the back surface of the semiconductor substrate.

11 Claims, 6 Drawing Sheets

(56) References Cited

U.S. PATENT DOCUMENTS

| | | |
|---|---|---|
| 2008/0241987 A1 | 10/2008 | Rohatgi et al. |
| 2008/0241988 A1 | 10/2008 | Rohatgi et al. |
| 2008/0290368 A1 | 11/2008 | Rubin |
| 2009/0007965 A1 | 1/2009 | Rohatgi et al. |
| 2009/0165855 A1* | 7/2009 | Sun et al. .................... 136/261 |
| 2009/0191348 A1* | 7/2009 | Hieslmair et al. ......... 427/398.1 |
| 2009/0260685 A1 | 10/2009 | Lee et al. |
| 2010/0024880 A1* | 2/2010 | Lee ................................ 136/256 |
| 2010/0032012 A1 | 2/2010 | Isaka et al. |
| 2010/0051099 A1 | 3/2010 | Cheong et al. |
| 2010/0065117 A1 | 3/2010 | Kim et al. |
| 2010/0087030 A1 | 4/2010 | Kim |
| 2010/0147378 A1 | 6/2010 | Lee et al. |
| 2010/0233840 A1 | 9/2010 | Rohatgi et al. |
| 2010/0248408 A1 | 9/2010 | Cheong et al. |
| 2010/0294357 A1 | 11/2010 | Hyun |
| 2010/0300507 A1 | 12/2010 | Heng et al. |
| 2010/0300518 A1* | 12/2010 | Moslehi et al. ............. 136/255 |
| 2010/0304522 A1 | 12/2010 | Rana et al. |
| 2011/0000536 A1 | 1/2011 | Lee et al. |
| 2011/0003424 A1 | 1/2011 | De Ceuster et al. |
| 2011/0027933 A1 | 2/2011 | Cheong et al. |
| 2011/0056551 A1 | 3/2011 | Kim et al. |
| 2011/0132425 A1 | 6/2011 | Kang et al. |
| 2011/0132426 A1 | 6/2011 | Kang et al. |
| 2011/0132444 A1 | 6/2011 | Meier et al. |
| 2011/0139236 A1* | 6/2011 | Lee et al. .................... 136/256 |
| 2011/0139239 A1* | 6/2011 | Lee et al. .................... 136/256 |
| 2011/0140226 A1 | 6/2011 | Jin et al. |
| 2011/0183458 A1 | 7/2011 | Weidman et al. |
| 2011/0214727 A1 | 9/2011 | Esturo-Breton et al. |
| 2011/0220201 A1 | 9/2011 | Sinha |
| 2011/0253210 A1 | 10/2011 | Lee et al. |
| 2011/0253211 A1 | 10/2011 | Krokoszinski |
| 2011/0265866 A1* | 11/2011 | Oh et al. ..................... 136/255 |
| 2011/0284079 A1* | 11/2011 | Pierreux ..................... 136/261 |
| 2011/0287578 A1 | 11/2011 | Wojtczuk et al. |
| 2012/0048362 A1 | 3/2012 | Lee et al. |
| 2012/0055538 A1 | 3/2012 | Lee et al. |
| 2012/0167978 A1 | 7/2012 | Shin et al. |
| 2012/0180860 A1 | 7/2012 | Ko et al. |
| 2012/0181667 A1 | 7/2012 | Geerligs et al. |
| 2012/0204948 A1 | 8/2012 | Barton et al. |
| 2013/0153018 A1 | 6/2013 | Lee et al. |

FOREIGN PATENT DOCUMENTS

| | | |
|---|---|---|
| JP | 2008-034609 A | 2/2008 |
| JP | 2008-204967 A | 9/2008 |
| JP | 2010-161310 A | 7/2010 |
| JP | 2010-533969 A | 10/2010 |
| JP | 2011-511453 A | 4/2011 |
| JP | 2011-142210 A | 7/2011 |
| WO | 2008099717 A1 | 8/2008 |
| WO | 2010-077018 A2 | 7/2010 |
| WO | 2011-033826 A1 | 3/2011 |
| WO | 2011025371 | 3/2011 |
| WO | 2011-152051 A1 | 12/2011 |
| WO | 2013006077 A1 | 1/2013 |

\* cited by examiner

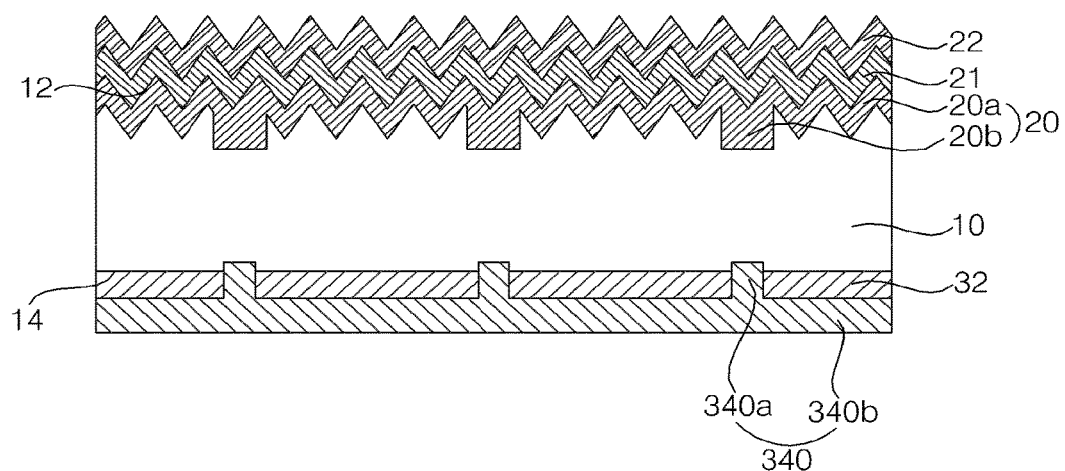

SOLAR CELL AND METHOD FOR MANUFACTURING THE SAME

CROSS-REFERENCE TO RELATED APPLICATION

This application is a Divisional of application Ser. No. 13/469,815, filed May 11, 2012 which claims the priority benefit of Korean Patent Application No. 10-2011-0136467, filed on Dec. 16, 2011, in the Korean Intellectual Property Office, which are incorporated by reference in their entirety for all purposes as if fully set forth herein.

BACKGROUND

1. Field of the Disclosure

The present disclosure relates to a solar cell and a method for manufacturing the same, and more particularly, to a solar cell manufactured by a simple method.

2. Description of the Related Art

In recent times, as it becomes more accepted that conventional energy resource such as petroleum and coal will be exhausted within a foreseeable timeframe, interest in alternative energy sources for replacing the conventional energy resources is gradually increasing. Among the alternative energy sources, a solar cell is spotlighted as a new generation cell using a semiconductor device for directly converting solar energy into electrical energy.

Efficiency improvements remain a very important goal for solar cells. Thus, various structures for improving the efficiency have been suggested. For example, a textured structure may be formed on surfaces of the semiconductor substrate in a silicon solar cell. However, in this structure, a back surface of the semiconductor substrate as well as a front surface of the semiconductor substrate is textured. This may lead to a reduced passivation property of the back surface. In order to avoid the reduction of the passivation property, a process for eliminating (or etching) the textured back surface may be additionally performed. However, in this case, the manufacturing process is complicated.

SUMMARY

The present disclosure is directed to a solar cell manufactured by a simple method and having high efficiency and a method for manufacturing the same.

A method for manufacturing a solar cell according to one embodiment includes a step of texturing a front surface of a semiconductor substrate having a first conductive type dopant by using a dry etching method, a step of forming an emitter layer by ion-implanting a second conductive type dopant into the front surface of the semiconductor substrate, a step of forming a back passivation film on a back surface of the semiconductor substrate; and a step of forming a first electrode electrically connected to the emitter layer and a second electrode being in partial contact with the back surface of the semiconductor substrate.

A solar cell according to another embodiment includes a semiconductor substrate, an emitter layer, a back surface field layer, a front passivation film, a back passivation film, a first electrode, and a second electrode. The semiconductor substrate has the first conductive type dopant, and a front surface of the semiconductor substrate has a surface roughness larger than that of a back surface of the semiconductor substrate. The emitter layer is formed adjacent to the front surface of the semiconductor substrate and having a second conductive type dopant. The back surface field layer is formed adjacent to the semiconductor substrate and having the first conductive type dopant. The front passivation film passivates the front surface of the semiconductor substrate. The back passivation film passivates the back surface of the semiconductor substrate. The first electrode is electrically connected to the emitter layer. The second electrode is in partial contact with the back surface of the semiconductor substrate. Here, the front surface of the semiconductor substrate has a surface roughness of about 1 μm or less.

BRIEF DESCRIPTION OF THE DRAWINGS

FIGS. 3a to 3g are cross-sectional views illustrating a method for manufacturing a solar cell according to an embodiment of the present invention.

DETAILED DESCRIPTION

Figure 1:
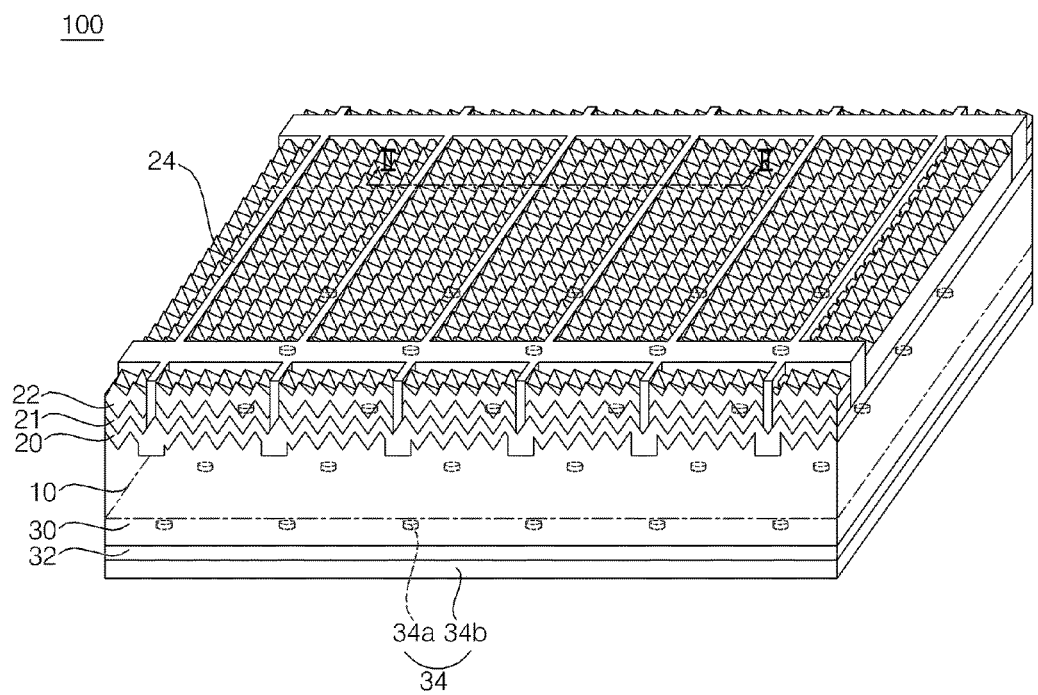
FIG. 1 is a perspective view illustrating a solar cell according to an embodiment of the present invention.

Hereinafter, embodiments of the present invention will be described with reference to the accompanying drawings. However, the present invention is not limited these embodiments, and various modifications of the exemplary embodiments are possible.

In order to clearly and concisely illustrate the embodiments, elements not related to the present invention are omitted in the figures. Also, elements similar to or the same as each other have the same reference numerals. In addition, the dimensions of layers and regions are exaggerated or schematically illustrated, or some layers are omitted for clarity of illustration. The dimensions of each part as drawn may not reflect an actual size.

In the following description, when a layer or substrate "includes" another layer or portion, it can be understood that the layer or substrate further includes still another layer or portion. Also, when a layer or film is referred to as being "on" another layer or substrate, it can be directly on the other layer or substrate, or intervening layers can also be present. Further, when a layer or film is referred to as being "directly on" another layer or substrate, it can be directly on the other layer or substrate, and thus, there is no intervening layer.

Figure 2:
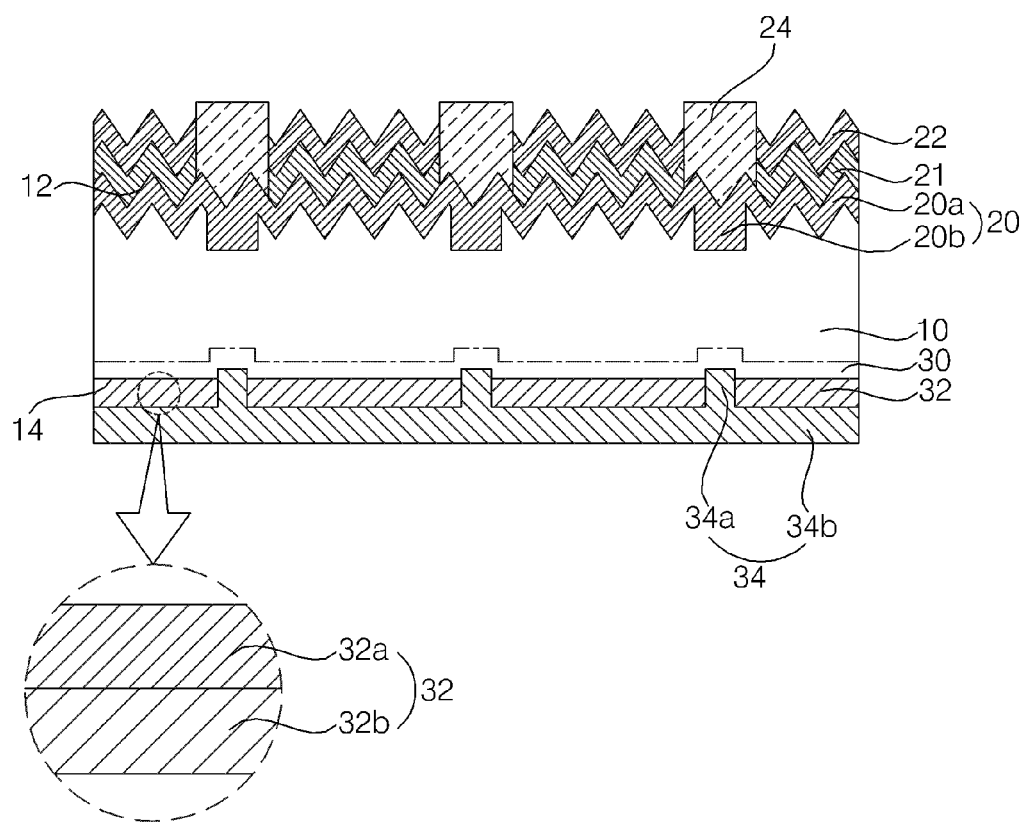
FIG. 2 is a cross-sectional view illustrating the solar cell taken along a line II-II of FIG. 1.

FIG. 1 is a perspective view illustrating a solar cell according to an embodiment of the present invention, and FIG. 2 is a cross-sectional view illustrating the solar cell taken along a line II-II of FIG. 1.

Referring to FIGS. 1 and 2, a solar cell 100 according to an embodiment includes a semiconductor substrate 10, an emitter layer 20 formed at or formed adjacent to a first surface 12 (hereinafter, referred to as "the front surface") of the semiconductor substrate 10, and a back surface field layer 30 formed at or adjacent to a second surface 14 (hereinafter, referred to as "the back surface") of the semiconductor substrate 10. Also, the solar cell 100 may include a first passivation film 21 (or a front passivation film), an anti-reflection film 22, and a first electrode 24 (or a plurality of first electrodes) formed on the front surface 12 of the semiconductor substrate 10. In addition, the solar cell 100 may include a second passivation film 32 (or a back passivation film) and a second electrode 34 (or a plurality of second electrodes) formed on the back surface 14 of the semiconductor substrate 10. Next, the detailed structure of the solar cell 100 will be described.

Semiconductor substrate 10 may include various semiconductor materials. For example, the substrate 10 may include silicon having a first conductivity type dopant. For the silicon, single crystal silicon or polycrystalline silicon may be used.

If the first conductivity type is a p-type, the semiconductor substrate 10 may include a p-type dopant, such as boron (B), aluminum (Al), gallium (Ga), or the like. If the first conductivity type is an n-type, the semiconductor substrate 10 may include a n-type dopant, such as phosphorus (P), arsenic (As), antimony (Sb), bismuth (Bi), or the like.

In the embodiment, only the front surface 12 of the semiconductor substrate 10 may be a textured surface having protruded and/or dented portions of various shapes (or an uneven surface). The back surface 14 of the semiconductor substrate 10 may be a relatively flat, even, and smooth surface. Therefore, the front surface 12 of the semiconductor substrate 10 may have a surface roughness larger than that of the back surface 14 of the semiconductor substrate 10.

Since the front surface 12 of the semiconductor substrate 10 has a relatively high surface roughness due to the protruded and/or dented portions formed by the texturing, the reflectance of the incident sun light through the front surface 12 of the semiconductor substrate 10 is reduced. This increases the light reaching the p-n junction between the semiconductor substrate 10 and the emitter layer 20, thereby reducing an optical loss of the solar cell 100. Also, since the back surface 14 of the semiconductor substrate 10 has a relatively low surface roughness, the passivation property at the back surface 14 of the semiconductor substrate 10 can be improved by minimizing the surface area.

That is, by texturing the front surface 12 of the semiconductor substrate 10 only (that is, by having the flat, even, and smooth back surface 14 of the semiconductor substrate 10), the efficiency of the solar cell 100 can be enhanced.

For example, the front surface 12 of the semiconductor substrate 10 has the surface roughness of about 1 μm or less (e.g., about 300-600 nm). The surface roughness is achieved by a reactive ion etching method that is a kind of a dry etching method and is a single-side etching method. The surface roughness formed by the dry etching is much lower (about 20-30 μm) than the surface roughness formed by a conventional wet etching method that is a both-sides etching method. That is, in the present embodiment, by using a dry and single-side etching method, the front surface 12 can have the surface roughness lower than the conventional surface roughness, and thus, the protruded and/or dented portions can be uniformly formed at the front surface 12. Thus, the manufacturing method of the solar cell 100 can be simplified, and will be described in detail later in this disclosure.

The back surface 14 of the semiconductor substrate 10 has a surface roughness of about 100 nm or less (for example, about 10-100 nm) accomplished by mirror-polishing. The back surface 14 of the semiconductor substrate 10 is flat, even, and smooth, and thus, the passivation property can be enhanced.

The emitter layer 20 having the second conductive type dopant may be formed at the front surface 12 of the semiconductor substrate 10. In the embodiment, the emitter layer 20 is formed by a single-side doping, and this will be described in detail later.

If the second conductivity type is an n-type, the emitter layer 20 may include a n-type dopant, such as phosphorus (P), arsenic (As), antimony (Sb), bismuth (Bi), or the like. If the second conductivity type is a p-type, the emitter layer 20 may include a p-type dopant, such as boron (B), aluminum (Al), gallium (Ga), or the like.

In the embodiment, the emitter layer 20 includes a first portion 20a formed adjacent to the anti-reflection film 22 where the front electrode 24 is not formed, and a second portion 20b being in contact with the front electrode 24. The second portion 20b has a resistance lower than that of the first portion 20a. For example, the first portion 20a has a resistance of about 50-100 ohm/□, and the second portion 20b has a resistance of about 10-30 ohm/□, but is not limited thereto. Thus, it is sufficient simply that the second portion 20b has a resistance lower than that of the first portion 20a.

In the embodiment, the shallow emitter can be achieved at the first portion 20a where the first electrode 24 is not formed and the sun light is incident, and thereby enhance the efficiency of the solar cell 100. In addition, a contact resistance between the front electrode 24 and the second portion 20b can be reduced by increasing a doping concentration of the second portion 20b being in contact with the front electrode 24. That is, since the emitter layer 20 has the selective emitter structure, the efficiency of the solar cell 100 can be maximized.

The first passivation film 21, anti-reflection film 22, and the front electrode 24 may be formed on the emitter layer 20 at the front surface 12 of the semiconductor substrate 10.

The first passivation film 21 may be substantially at the entire front surface 12 of the semiconductor substrate 10, except for the portion where the front electrode 24 is formed. The first passivation film 21 passivates defects at a surface or a bulk of the emitter layer 20. Because the defects at the emitter layer 20 are passivated, recombination sites of minority carrier are reduced or eliminated, thereby increasing an open-circuit voltage (Voc) of the solar cell 100. Accordingly, the open-circuit voltage (Voc) of the solar cell 100 can be increased by the passivation layer 21, and thus, the efficiency of the solar cell 100 can be enhanced.

The anti-reflection film 22 may be substantially at the entire front surface 12 of the semiconductor substrate 10 on the first passivation film 21, except for the portion where the front electrode 24 is formed. Anti-reflection film 22 reduces reflectance (or reflectivity) of sun light incident to the front surface 12 of the semiconductor substrate 10. Therefore, an amount of the sun light reaching the p-n junction formed between the semiconductor substrate 10 and the emitter layer 20 can be increased, thereby increasing short circuit current (Isc) of the solar cell 100.

The first passivation film 21 may include various materials. In the embodiment, the first passivation film 21 may include a material for maximizing the passivation property according to the conductive type of the second conductive type dopant included in the emitter layer 20. For example, when the emitter layer 20 includes the n-type dopant, the first passivation film 21 may include a silicon oxide. Selectively, when the emitter layer 20 includes the p-type dopant, the first passivation film 21 may include an aluminum oxide.

The anti-reflection film 22 may include various materials for preventing reflection. For example, the anti-reflection film 22 may include a silicon nitride film, but is not limited thereto. Anti-reflection film 22 may have a single film structure or a multi-layer film structure including, for example, at least one material selected from the group consisting of silicon nitride, silicon nitride including hydrogen, silicon oxide, silicon oxy nitride, $MgF_2$, ZnS, $TiO_2$, and $CeO_2$.

Also, instead of the first passivation film 21 and the anti-reflection film 22, one film for replacing the first passivation film 21 and the anti-reflection film 22 may be formed. In addition, one of the first passivation film 21 and the anti-reflection film 22 may be omitted. That is various modifications are possible.

The first electrode 24 electrically connected to the emitter layer 20 (for example, directly on the emitter layer 20) by penetrating the first passivation film 21 and the anti-reflection film 22 may have a material and a structure for suitable to minimize shading loss, contact resistance, and so on.

For example, if the emitter layer 20 includes the n-type dopant, the first electrode 24 may include silver (Ag). If the emitter layer 20 includes the p-type dopant, the first electrode 24 may include a silver layer formed on (e.g., directly on) the emitter layer 20 and an aluminum layer formed on the silver layer. Then, the contact resistance between the emitter layer 20 and the first electrode 24 can be minimized.

The first electrode 24 may have a grid shape. The first electrode 24 may have a thickness of about 20 μm or more (e.g., about 20-40 μm) for achieving a sufficiently low resistance, and may have a width of about 60 μm or less (for example, about 30-60 μm) for minimizing shading loss, but is not limited thereto.

The first electrode 24 may include various materials such as copper, zinc, tin, indium, titanium, gold, a transparent conductive material, and combinations thereof. Also, the first electrode 24 may have various thicknesses and widths.

The back surface field layer 30 is formed at or adjacent to the back surface 14 of the semiconductor substrate 10, and has the first conductive type dopant with a doping concentration higher than that of the semiconductor substrate 10. Back surface field layer 30 can prevent recombination of electron-hole pairs at the back surface 14 of the semiconductor substrate 10, and therefore enhance the efficiency of the solar cell 100.

The second passivation film 32 and the back electrode 34 may be formed on the back surface field layer 30 at the back surface 14 of the semiconductor substrate 10.

The second passivation film 32 may be substantially on the entire back surface 14 of the semiconductor substrate 10, except for the portion where the back electrode 34 is connected to the semiconductor substrate 10. The second passivation film 32 passivates defects at the back surface 14 of the semiconductor substrate 10, and eliminates a recombination site of minority carriers existing on the back surface 14 of the semiconductor 10. Thus, an open circuit voltage (Voc) of the solar cell 100 can be increased.

In the embodiment, the second passivation film 32 may include a material maximizing the passivation property according to the conductive type of the first conductive type dopant.

For example, when the back surface field layer 30 includes the p-type dopant, as shown in a dotted circle of FIG. 2, the second passivation film 32 includes a p-type oxidation film 32a formed on (e.g., directly on) the back surface 14 of the semiconductor substrate 10 and a silicon oxide film 32b formed on (e.g., directly on) the p-type oxidation film 32a.

The p-type oxidation film 32a includes at least one material selected from the group consisting of a rare earth oxide (e.g., an yttrium oxide), an aluminum oxide, and a zirconium oxide. The aluminum oxide has negative charge, and thus, it is the most suitable for passivating the back surface field layer 30 having the p-type. The rare earth oxide and the zirconium oxide have an up-conversion property for converting long wavelengths of the sun light to short wavelengths utilized by for the solar cell 100. For example, the yttrium oxide is excited at 980 nm and emits photons of 550 nm with high energy. The zirconium oxide is excited at 980 nm and emits photons of 550 nm, 660 nm, and 675 nm with high energy. In addition, the aluminum oxide, the zirconium oxide, and the rare earth oxide has a high transmittance, and thus, it acts as a back reflector along with the second electrode 34.

Additionally, the p-type oxidation film 32a includes the p-type conductive dopant itself. Thus, the p-type conductive dopant in the p-type oxidation film 32a is diffused, and then, the back surface field layer 30 of the p-type can be formed. In the embodiment, the back surface field layer 30 is entirely formed, and the second electrode 34 is partially electrically connected to (example.g., in point contact with) the back surface field layer 30. Thus, since the back surface field layer 30 is entirely formed, the resistance can be reduced compared to a localized back surface field layer. This set-up will be described in more detail below.

The silicon oxide film 32b formed on the p-type oxidation film 32a improves the passivation property of the back surface 14 of the semiconductor substrate 10, but is not limited thereto. That is, there may be only the p-type oxidation film 32a without the silicon oxide film 32b, and, in this case, the manufacturing process can be simplified.

For example, the p-type oxidation film 32a has a thickness of about 10-100 nm, and the silicon oxide film 32b has a thickness of about 10-200 nm, but is not limited thereto. Each of the films 32a/32b may have various thicknesses.

If the back surface field layer 30 includes the n-type dopant, the second passivation film 32 may have a single film structure or a multi-layer film structure including, for example, at least one material selected from the group consisting of silicon nitride, silicon nitride including hydrogen, silicon oxide, silicon oxy nitride, $MgF_2$, ZnS, $TiO_2$ and $CeO_2$. For example, the second passivation film 32 has a stacked structure of a silicon nitride film and a silicon oxide film.

The second electrode 34 which is electrically connected to the back surface field layer 30 by penetrating the second passivation film 32 may have a material and a structure to minimize passivation loss, contact resistance, and so on.

For example, if the back surface field layer 30 has the p-type dopant, the second electrode 34 may include aluminum. If the back surface field layer 30 has the n-type dopant, the second electrode 34 may include a silver layer formed on (e.g., directly on) the semiconductor substrate 10 and an aluminum layer formed on (e.g., directly on) the silver layer. This way, the contact resistance between the back surface field layer 30 and the second electrode 34 can be minimized.

Additionally, the second electrode 34 along with the second passivation film 32 can act as a back reflector. That is, the aluminum of the second electrode 34 may act as the back reflector. In addition, the aluminum is diffused into the back surface 14 of the semiconductor substrate 10 during firing for forming the second electrode 34, and the back surface field layer 30 is formed, and will be described in more detail later in this disclosure.

The second electrode 34 includes a first portion 34a being in point contact with the back surface field layer 30 of the semiconductor substrate 10 by penetrating the second passivation film 32, and a second portion 34b being connected to the first portion 34a and being entirely formed on the second passivation film 32. Second electrode 34 is electrically connected to the back surface field layer 30 or the semiconductor substrate 10 through the first portion 34a, and the second passivation film 32 is formed except for where a portion of the first portion 34a is located. Thus, the passivation property can increase. In addition, the back surface reflection can be enhanced by the second portion 34b being entirely formed on the second passivation film 32 and the back surface 14, thereby improving the light utilization ratio.

That is, according to the embodiment, the solar cell 100 where only the front surface 12 of the semiconductor substrate 10 is textured has materials and/or structures for optimizing the first and second passivation films 21 and 32, the anti-reflection film 22, and the first and second electrodes 32 and 34. These optimizing materials/structures enhance the efficiency of the solar cell 100. That is, the first and second passivation films 21 and 32, and the anti-reflection film 22 have materials suitable for the emitter layer 20 and the back surface field layer 30, the first electrode 32 has the structure and the material considering shading loss, ohmic loss, and so on, and the second electrode 34 has the structure of the material considering passivation loss, ohmic loss, reluctance, and so on. In the solar cell 100, one of the primary goals is increase in efficiency. The above disclosure comprises materials and structures to improve the efficiency of the solar cell 100.

In the above solar cell 100, a p-n junction is formed by the semiconductor substrate 10 and the emitter layer 20 having different conductive types. When the sun light is incident to the p-n junction, the electrons (or the holes) generated by the photoelectric effect move to the back surface 14 of the semiconductor substrate 10, and the holes (or the electrons) generated by the photoelectric effect move to the front surface 12 of the semiconductor substrate 10. By this method electrical energy is generated.

Hereinafter, a method for manufacturing a solar cell according to another embodiment will be described with reference to FIGS. 3a to 3g. In the following description, described portions from above will be omitted, and previously un-described portions from above will be described in more detail below.

FIGS. 3a to 3g are cross-sectional views for illustrating a method for manufacturing a solar cell according to an embodiment of the present invention.

Figure 3A:
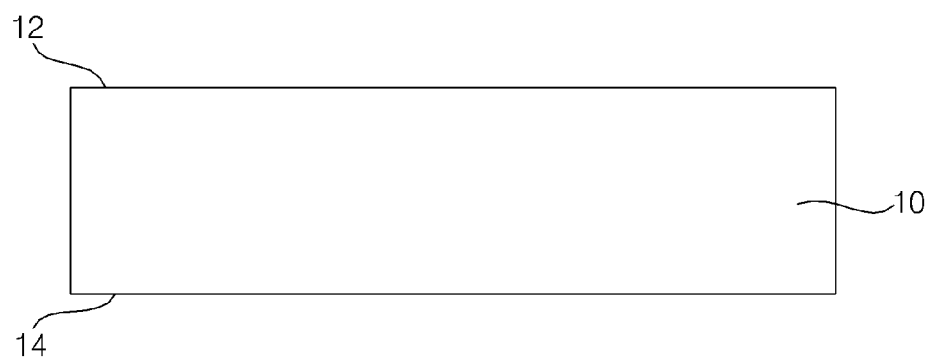

As shown FIG. 3a, a front surface 12 and a back surface 14 of the semiconductor substrate 10 are mirror-polished for planarizing the surfaces and eliminating defects of the inside.

Semiconductor substrate 10 may be formed by sawing a semiconductor ingot. During the sawing, saw damage may be generated at the front surface 12 and the back surface 14 of the semiconductor substrate 10. In order to eliminate the portion having the saw damage, the front surface 12 and the back surface 14 of the semiconductor substrate 10 are etched by mirror-polishing. The mirror-polishing is performed by a wet alkali solution (e.g., high-concentrated potassium hydroxide (KOH) solution). By the wet etching for the mirror-polishing, the process time can be shorten.

Because of the mirror-polishing, each of the front surface 12 and the back surface 14 of the semiconductor substrate 10 has a surface roughness of about 100 nm or less (e.g., about 10-100 nm).

Figure 3B:
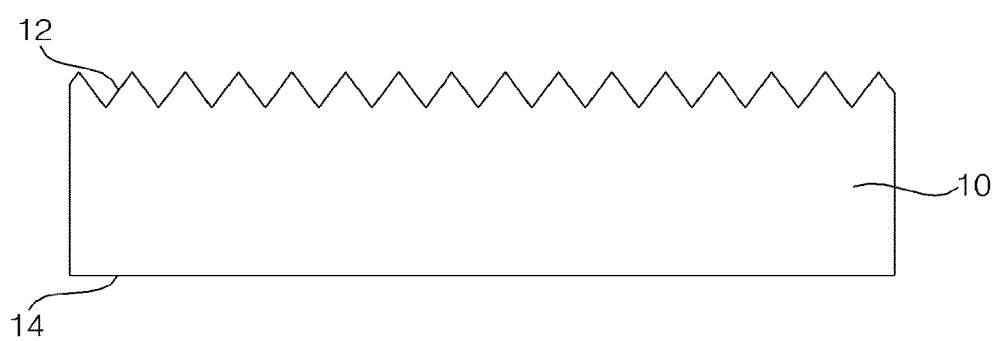

Next, as shown in FIG. 3b, the front surface 12 of the semiconductor substrate 10 is etched by a single-side etching method. Specifically, only the front surface 12 of the semiconductor substrate 10 is textured so that the front surface 12 of the semiconductor substrate 10 can have the surface roughness larger than the back surface 14. In the embodiment, for example, a reactive ion etching (RIE) method is used for the single-side etching method.

The reactive ion etching method is a kind of a dry etching method. In the reactive ion etching method, plasma is generated after supplying etching gas (e.g., $Cl_2$, $SF_6$, $NF_3$, HBr, and so on) for the etching. According to the reactive ion etching method, uniform protruded and/or dented portions can be formed at the front surface 12 of the semiconductor substrate 10, regardless of the crystal orientation. Also, a thickness of the semiconductor substrate 10 etched by the reactive ion etching method is smaller than that by the conventional wet etching method. Accordingly, the front surface 12 of the semiconductor substrate 10 has a surface roughness of about 1 µm or less (e.g., 300-600 nm).

In the embodiment, the reflectance at the front surface 12 of the semiconductor substrate 10 can be reduced by the single-side etching method, and the passivation property at the back surface 14 of the semiconductor substrate 10 can be improved by minimizing the surface area of the back surface 14.

According to the embodiment, after the single-side etching, an additional etching (e.g., a wet etching) may be performed in order to eliminate the damage induced by the single-side etching. However, the additional etching is optional, and thus, it may be omitted.

Figure 3C:
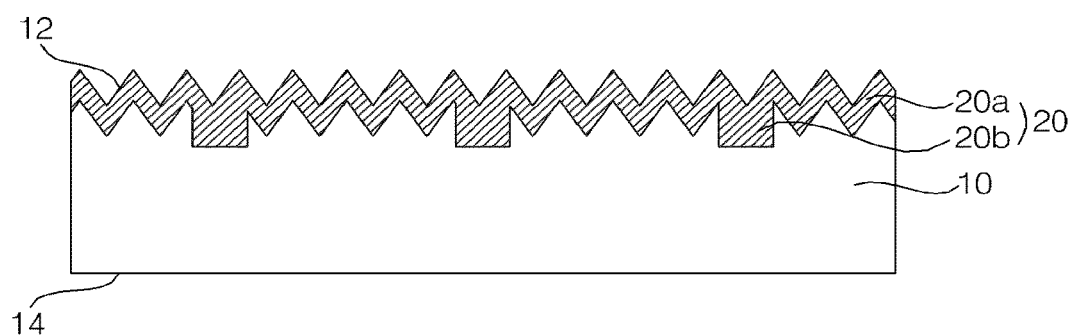

Next, as shown in FIG. 3c, only the front surface 12 of the semiconductor substrate 10 is doped with the second conductive type dopant by a single-side doping method in order to form the emitter layer 20. In the single-side doping method, an ion-implantation method, a plasma doping method, a spin on doping method, or a spray doping method may be used. For example, the ion-implantation method may be preferably used. Here, relatively more dopants may be doped into the second portion 20b than the first portion 20a by using a mask or by repeating the doping process two times or more. In this way, the emitter layer 20 has a selective emitter structure.

After the doping, the semiconductor substrate 10 is heated to activate the second conductive type dopant. When the second conductive type dopant is doped into the semiconductor substrate 10, the doped second conductive type dopant is not positioned at a lattice site and is not activated. When the semiconductor substrate 10 is heated, the second conductive type dopant moves the lattice site and is activated.

As described in the above, if the emitter layer 20 is of the n-type, the n-type dopant (such as phosphorus, arsenic, bismuth, antimony, or the like) is doped into the front surface 12 of the semiconductor substrate 10 by the single-side doping method. If the emitter layer 20 is of the p-type, the p-type dopant (such as boron, aluminum, gallium, or the like) is doped into the front surface 12 of the semiconductor substrate 10 by the single-side doping method.

In known processes, the above structure (only the front surface 12 of the semiconductor substrate 10 has the protruded and/or dented portions formed by the texturing and the emitter layer 20 and the back surface 14 of the semiconductor substrate 10 do not have the protruded and/or dented portions and the emitter layers 20) is formed as follows: front surface 12 and back surface 14 of the semiconductor substrate 10 are wet-etched (that is, both surfaces are etched). Then, emitter layer 20 is formed on entire surfaces of the semiconductor substrate 10 (including the front surface 12 and the back surface 14 of the semiconductor substrate 10) by doping the front surface 12 and the back surface 14 of the semiconductor substrate 10 through a thermal diffusion. After that, an anti-reflection film 22 is formed on the front surface 12 of the semiconductor substrate 10, and the semiconductor substrate 10 is etched. Next, the front surface 12 of the semiconductor substrate 10 is not etched by the anti-reflection film 22, and only the back surface 14 of the semiconductor substrate 10 is etched.

Therefore, the protruded and/or dented portions and the emitter layer of at the back surface 14 are eliminated. That is, in the known processes, a method for removing the protruded and/or dented portions and the emitter layer of the back surface 14 is additionally necessary because of the double-side etching method and the double-side doping method. Therefore, the known processes are very complicate.

On the other hand, according to the embodiment, the above structure (wherein, only the front surface 12 of the semiconductor substrate 10 has the protruded and/or dented portions formed by the texturing and the emitter layer 20) can be easily formed by using the single-side etching method and the single-side etching method.

Figure 3D:
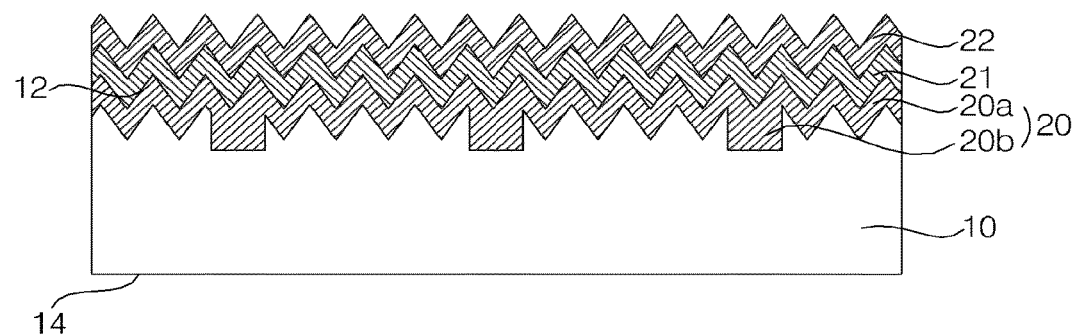

Next, as shown in FIG. 3d, a first passivation film 21 and an anti-reflection film 22 are formed on the front surface 12 of the semiconductor substrate 10. The first passivation film 21 and the anti-reflection film 22 may be formed by various methods such as a vacuum evaporation, a chemical vapor deposition, a spin coating, a screen printing, or a spray coating.

As described in the above, for example, if the emitter layer 20 includes the n-type dopant, the first passivation film 21 may include a silicon oxide. If the emitter layer 20 includes the p-type dopant, the first passivation film 21 may include an aluminum oxide. Also, for example, the anti-reflection film 22 may include silicon nitride, silicon nitride including hydrogen, silicon oxide, silicon oxy nitride, $MgF_2$, ZnS, $TiO_2$, $CeO_2$, or the like. Also, instead of the first passivation film 21 and the anti-reflection film 22, one film for replacing the first passivation film 21 and the anti-reflection film 22 may be formed. Additionally, one of the first passivation film 21 and the anti-reflection film 22 may be omitted. That is, various modifications are possible.

Figure 3E:
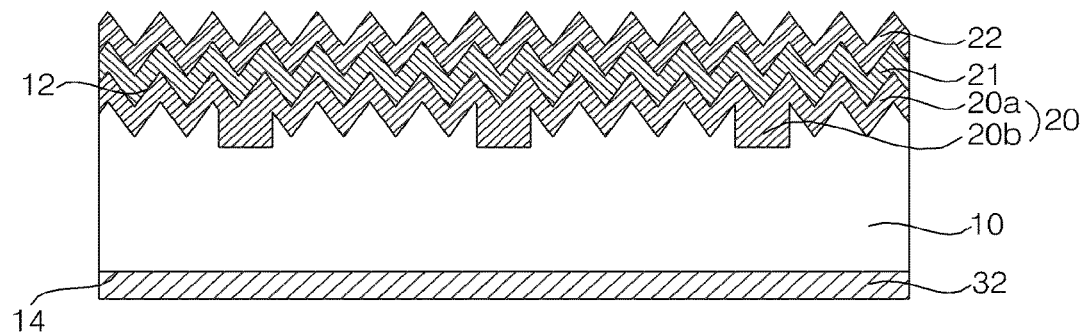

Next, as shown in FIG. 3e, a second passivation film 32 is formed on the back surface 14 of the semiconductor substrate 10. The second passivation film 32 may be formed by various methods such as a vacuum evaporation, a chemical vapor deposition, a spin coating, a screen printing, or a spray coating.

As described in the above, if the back surface field layer 30 includes the p-type dopant, the second passivation film 30 includes a p-type oxidation film 32a formed on (e.g., directly on) the back surface 14 of the semiconductor substrate 10 and a silicon oxide film 32b formed on (e.g., directly on) the p-type oxidation film 32a (as shown in a dotted circle of FIG. 2). If the back surface field layer 30 includes the n-type dopant, the second passivation film 32 may include silicon nitride, silicon nitride including hydrogen, silicon oxide, silicon oxy nitride, $MgF_2$, ZnS, $TiO_2$, $CeO_2$, or the like. For example, the second passivation film 32 has a stacked structure of a silicon nitride film and a silicon oxide film.

Next, as shown in FIG. 3f, a second electrode layer 340 is formed on the back surface 14 of the semiconductor substrate 10. The second electrode layer 340 may include a first portion 340a being in point contact with the back surface field layer 30 of the semiconductor substrate 10 (or the back surface 14 of the semiconductor substrate 10) by penetrating the second passivation film 32, and a second portion 340b being connected to the first portion 340a and being entirely formed on the second passivation film 32.

The second electrode layer 340 may be formed as follows. A through hole is formed at a portion of the second passivation film 32 by irradiating a laser at the back surface 14 of the semiconductor substrate 10, corresponding to the first portion 340a. Then, the second electrode layer 340 is formed on the second passivation film 32 to fill the through hole by a plating method, an evaporation method, a screen printing method, and so on.

Selectively, the second electrode layer 340 is entirely formed on the second passivation film 32 by a plating method, an evaporation method, a screen printing method, and so on. After that, the laser is irradiated to correspond to a position of the first portion 340a. Then, the semiconductor substrate 10, the second passivation film 32, and the second electrode layer 340 are melted together by the laser, and the first portion 340a is formed. The method is referred to as a laser firing contact method. The type, wavelength, and/or intensity of the laser may need to be varied based on the materials and thickness of the second passivation film 32 and the second electrode layer 340.

As described above, if the back surface field layer 30 has the p-type dopant, the second electrode 34 may include aluminum. If the back surface field layer 30 has the n-type dopant, the second electrode 34 may include a silver layer formed on (e.g., directly on) the semiconductor substrate 10 and an aluminum layer formed on (e.g., directly on) the silver layer.

Figure 3G:
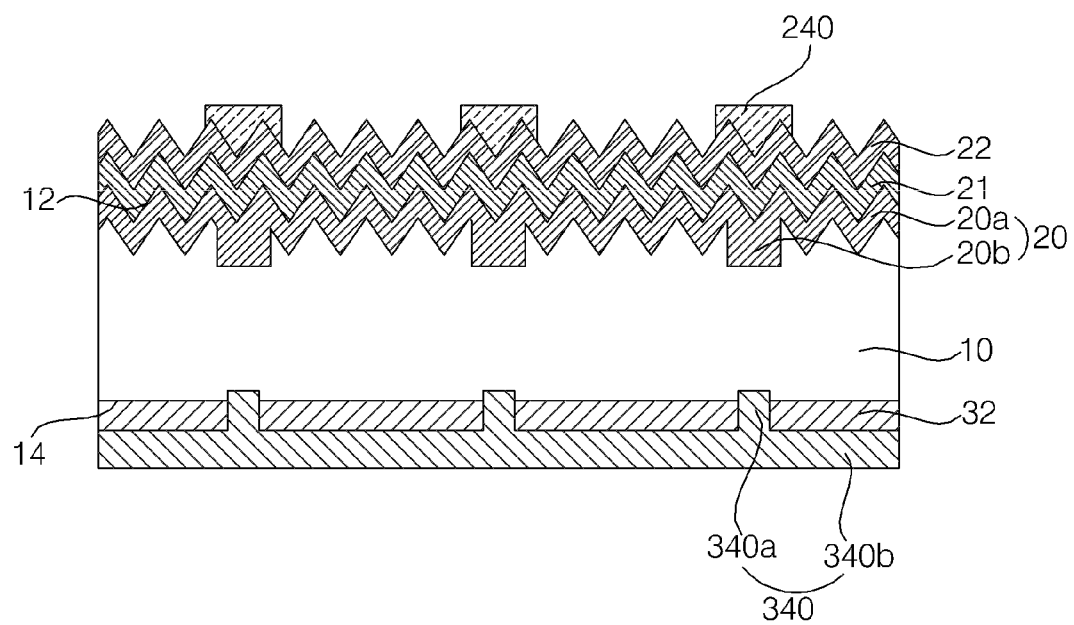

Next, as shown in FIG. 3g, a first electrode layer 240 is formed on the anti-reflection film 22 at the front surface 12 of the semiconductor substrate 10. The front electrode layer 240 may be formed by coating a paste including metal having a high electric property (e.g., silver), glass frit, a binder, and a solvent. For example, the front electrode layer 240 is coated on the semiconductor substrate 10 by a printing method.

Next, the front electrode layer 240 and the back electrode layer 340 are fired to form a front electrode 24 (shown in FIG. 1) and a back electrode 34 (as shown in FIG. 1). Thus, the solar cell 100 of FIG. 1 having the first and second electrode 24 and 34 is manufactured. In the firing, the semiconductor substrate 10 is heat-treated at a suitable temperature (for example, about 600-900° C.).

When the front and back electrode layers 240 and 340 are fired, by firing through, the front electrode 24 penetrates the first passivation film 21 the anti-reflection film 22 and is in contact to the emitter layer 20. Also, when the semiconductor substrate 10 has the p-type dopant, the aluminum included in the second electrode layer 340 is diffused into the back surface 14 of the semiconductor substrate 10, and thus, the back surface field layer 30 is formed adjacent to the back surface 14. Also, the second electrode 34 is in point contact with the back surface 14 of the semiconductor substrate 10, and the area of the second passivation film 32 can be maximized. In addition, the back surface field layer 30 is substantially entirely formed at the back surface 14 of the semiconductor substrate 10. Accordingly, without reducing the passivation property, the serial resistance at the back surface 14 of the semiconductor substrate 10 can be reduced.

Meanwhile, when the semiconductor substrate 10 has the n-type dopant, a process for forming the back surface field layer 30 by implanting the n-type dopant may be additionally performed, before the process for forming the second passivation film 32. Then, the second electrode 34 is in point contact with the back surface 14 of the semiconductor substrate 10, and the back surface field layer 30 is entirely formed at the back surface 14 of the semiconductor substrate 10.

The above methods are just examples, and thus, the manufacturing orders of the first and second passivation films 21 and 32, the anti-reflection film 22, and the first second electrode layers 240 and 340 may be freely modified.

In the embodiment, by the simple method of using the single-side etching and the single-side doping, the front surface 12 of the silicon semiconductor substrate 10 can have the relatively high surface roughness and the back surface 14 of the semiconductor substrate 10 can be a relatively flat surface having the relatively low surface. Accordingly, the light loss can be decreased by reducing the light reflectance at the front surface 12, and the passivation property at the back surface 14 can be enhanced. Finally, the efficiency of the solar cell 100 can be improved.

That is, according to at least one embodiment, the solar cell 100 having the high efficiency can be formed by a simple process, thereby simultaneously improving the efficiency and productivity.

Certain embodiments of the invention have been described. However, the invention is not limited to the specific embodiments described above, and various modifications of the embodiments are possible by those skilled in the art to which the invention belongs without leaving the scope of the invention defined by the appended claims. Also, modifications of the embodiments should not be understood separately from the technical principles or prospects of the invention.

What is claimed is:

1. A solar cell, comprising:
   a semiconductor substrate having a base dopant of a first conductive type, wherein a front surface of the semiconductor substrate has a surface roughness larger than that of a back surface of the semiconductor substrate;
   an emitter layer adjacent to the front surface of the semiconductor substrate and having a second conductive type;
   a back surface field layer on the semiconductor substrate having a first conductive type dopant of the first conductive type;
   a front passivation film for passivating the front surface of the semiconductor substrate;
   a back passivation film for passivating the back surface of the semiconductor substrate and having a contact hole;
   a first electrode electrically connected to the emitter layer; and
   a second electrode in partial contact with the back surface of the semiconductor substrate through the contact hole,
   wherein the back passivation film comprises the first conductive type dopant, and
   wherein the second electrode comprises the first conductive type dopant,
   wherein a portion of the back surface field layer is disposed between the semiconductor substrate and a back passivation film, and
   wherein an another portion of the back surface field layer is disposed between the semiconductor substrate and the second electrode,
   wherein the portion of the back surface field layer and the back passivation film comprise a same conductive dopant material, and
   wherein the another portion of the back surface field layer and the second electrode comprise a same conductive dopant material,
   a protrusion of the second electrode is protruded from the back passivation film and, an end of the protrusion of the second electrode contacts the back surface field layer.

2. The solar cell according to claim 1, wherein the first conductive type is a p-type and the second conductive type is an n-type, and
   wherein the back passivation film comprises a p-type oxidation film.

3. The solar cell according to claim 2, wherein the p-type oxidation film comprises at least one material selected from the group consisting of a rare earth oxide, an aluminum oxide, and a zirconium oxide.

4. The solar cell according to claim 2, wherein the front passivation film comprises a silicon oxide film.

5. The solar cell according to claim 2, wherein the back passivation film further comprises a silicon oxide film on the p-type oxidation film.

6. The solar cell according to claim 1, wherein the second electrode comprises aluminum, and the back passivation film comprises aluminum oxide.

7. The solar cell according to claim 1, wherein the back surface field layer is on the back passivation film and the second electrode.

8. The solar cell according to claim 1, wherein the back passivation film comprises a compound including the first conductive type dopant and oxygen.

9. The solar cell according to claim 8, wherein the first conductive type dopant comprises aluminum, and
   wherein the back passivation film comprises an aluminum oxide.

10. The solar cell according to claim 1, wherein the surface roughness of the front surface of the semiconductor substrate is 300-600 nm.

11. The solar cell according to claim 1, wherein the surface roughness of the back surface of the semiconductor substrate is 100 nm or less.

* * * * *